United States Patent
Ishigami et al.

(10) Patent No.: US 7,290,944 B2
(45) Date of Patent: Nov. 6, 2007

(54) BOARD ASSEMBLY, OPTICAL TRANSCEIVER USING SAME AND METHOD FOR MOUNTING SAME ON OBJECT

(75) Inventors: Yoshiaki Ishigami, Hitachi (JP);
Noribumi Kobayashi, Kitaibaraki (JP);
Ryuta Takahashi, Hitachi (JP);
Akihiro Hiruta, Hitachi (JP);
Yoshinori Sunaga, Hitachinaka (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/285,004

(22) Filed: Nov. 23, 2005

(65) Prior Publication Data
US 2006/0257081 A1    Nov. 16, 2006

(30) Foreign Application Priority Data
May 12, 2005 (JP) ............................ 2005-139631

(51) Int. Cl.
*G02B 6/36* (2006.01)

(52) U.S. Cl. .......................................... 385/92; 385/88

(58) Field of Classification Search ............. 385/88–94
See application file for complete search history.

(56) References Cited

U.S. PATENT DOCUMENTS

| | | | |
|---|---|---|---|
| 5,005,939 A | | 4/1991 | Arvanitakis et al. |
| 5,742,480 A | | 4/1998 | Sawada et al. |
| 5,963,693 A | * | 10/1999 | Mizue et al. ................ 385/88 |
| 6,950,314 B2 | * | 9/2005 | Reznik et al. ............. 361/764 |

FOREIGN PATENT DOCUMENTS

JP         8-136765         5/1996

* cited by examiner

*Primary Examiner*—Sarah Song
(74) *Attorney, Agent, or Firm*—McGinn IP Law Group, PLLC

(57) ABSTRACT

A board assembly, an optical transceiver using same, and a method for mounting a board assembly that can relax a stress occurred at a flexible board. A board assembly 1 comprises a flexible board 2, a first rigid board 3, and a second rigid board 4. The first rigid board 3 and the second rigid board 4 are connected with each other by means of the flexible board 2. Since the flexible board 2 is preformed before the attachment, the stress occurred at the flexible board 2 can be relaxed.

14 Claims, 8 Drawing Sheets

BOARD ASSEMBLY, OPTICAL TRANSCEIVER USING SAME AND METHOD FOR MOUNTING SAME ON OBJECT

The present application is based on Japanese Patent Application No. 2005-139631 filed on May 12, 2005, the entire contents of which are incorporated herein by reference.

BACKGROUND OF THE INVENTION

1. Field of the Invention

The present invention relates to fabrication of a structure (such as optical transceiver) in which both of rigid boards mounted on, for instance, different objects are connected with each other by a flexible board, and more particularly, to a board assembly, an optical transceiver using the same and a method for mounting the same on the objects.

2. Description of the Related Art

An optical transceiver is used as an interface for connecting an optical transmission path and an electric communication device, which conducts an electrical processing of optical transmission signal of the optical transmission path. For achieving this purposes, the optical transceiver is provided with a built-in optical module and built-in electric circuit board(s). The optical module is an integrated module comprising an optical fiber coupled to the optical transmission path, a lens for focusing a light transmitted through the optical fiber, and an optical element for receiving the focused light (or for transmitting the light, adversely). A lead of the optical module for leading an electric current from the optical element is usually provided to project from an end of the optical module, and another end of the optical module is provided to face to the optical transmission path. On the other hand, the electric circuit board is provided in vicinity of the lead so as to shorten a distance from the optical element.

For connecting a number of optical transmission paths to a single communication device, components of the optical transceiver are required to be collectively disposed. For answering to this request, the optical transceiver is provided with a housing, which accommodates the electric circuit board in a longitudinal direction of the optical module. The vertical length and lateral width of the housing are short, and only a length in a depth direction of the housing is long. Accordingly, the electric circuit board accommodated in this housing naturally becomes elongated. When the lead projected from the optical module is directly fixed by solder to an end of the electric circuit board, stress is easily applied to this soldered part, lead or optical element, as well as an optical axis of the optical module is easily deviated.

Therefore, as shown in FIG. 1, a device (called as "board assembly") has been conventionally used. In the board assembly, a first rigid board 53 to which terminals 55 of an optical module 51 are soldered and a second rigid board 54 on which an electric circuit (not shown) is mounted are formed separately, and both of the first and second rigid boards 53, 54 are connected with each other by a flexible board 52. Japanese Patent Laid-Open (Kokai) No. 8-136765 (JP-A-8-136765) discloses such board assembly. A part of the electric circuit can be mounted also on the first rigid board 53. An optical module stay member (not shown) for accommodating the optical module 51 and a rib (not shown) for fixing the second rigid board 54, on which the electric circuit is mounted, are formed in a housing (not shown). After putting the optical module 51 in the optical module stay member, the board assembly is carried into the housing. Then, the second rigid board 54, on which the electric circuit is mounted, is fixed by screws to the housing that is the object, while the first rigid board 53 is fixed to the optical module 51 which is the object by soldering the terminals 55. Finally, the housing is closed by a cap (not shown), such that the optical module 51 is pressed into the optical module stay member.

As described above, by providing the board assembly in which both of the first and second rigid boards 53, 54 are connected by the flexible board 52, even if different forces function to the first and second rigid boards 53, 54, or if the first or second rigid board 53, 54 is out of position, a stress will be absorbed by transformation of the flexible board 52. Accordingly, strain of the leads or misalignment of an optical axis of the optical module 51 can be relaxed.

In the prior art shown in FIG. 1, the second rigid board 54 is mounted on the housing that is the object in a substantially parallel position to the optical axis of the optical module 51, and the first rigid board 53 is mounted on the optical module 51 that is the object in a position orthogonal to the optical axis of the optical module 51, so that the flexible board 52 is bent with a predetermined curvature (radius) R at an area around the intersection of extended planes of the first and second rigid board 53, 55. When observed from a larger viewpoint, the flexible board 52 is bent with a right angle.

However, since the first and second rigid boards 53, 54 are mounted on the each object in different positions, the stress is applied to the flexible board 52. The flexible board 52 has elasticity, so that a repulsive force functions to turn back a curved portion to a state of an original flat plane. Since the optical module 51 receives this repulsive force, a risk of causing the strain of the leads or the misalignment of the optical axis of the optical module cannot be completely overcome.

In addition, it is a complicated operation to apply the bending force to the flexible board 52 while carrying the board assembly into the housing, and it is inevitable to apply unnecessary force to the optical module 51, or to each of the first and second rigid boards 53, 54 during this process.

Further, a certain kind of the flexible board comprises a first conductive layer referred as a "signal layer" on which signal wiring pattern is provided, and a second conductive layer referred as a "ground layer" provided separately from the first conductive layer. Namely, in this kind of flexible board, a ground layer 62 and signal layer 64 are interposed by protective layers (insulating films) 61, 63, and 65 as shown in FIG. 2. The ground layer 62 is a so-called mat (plane) ground layer, which occupies an entire surface or almost entire surface of the flexible board, and has an effect of lowering ground impedance and increasing a shielding property, etc. However, since one more conductive layer is provided, hardness of the flexible board is increased, so that the repulsive force to turn back the curved portion to the original flat plane is increased. Therefore, the aforementioned problems of the strain of the leads or misalignment of the optical axis become more serious.

SUMMARY OF THE INVENTION

Accordingly, it is an object of the invention to provide a board assembly, an optical transceiver using the same, and a method for mounting the same on the objects, by which a stress occurred in the flexible board can be relaxed, so that the problems of the strain of the leads and misalignment of the optical axis can be solved.

According to a first feature of the present invention, a board assembly, comprises:

a first rigid board;

a second rigid board; and a flexible board for connecting the first rigid board and the second rigid board;

wherein the first and second rigid boards are mounted on objects in different positions, and the flexible board is preformed to have a curved portion of a predetermined curvature.

According to a second feature of the present invention, in the board assembly, the curved portion of the flexible board may be provided on an opposite side of the first rigid board in regard to an extended plane of the second rigid board, where the first rigid board is not located.

According to a third feature of the invention, in the board assembly, the flexible board may be bent once at a space lower than an extended plane of the second rigid board where the first rigid board is not located, a curve direction is then inverted, a curvature gradually increases to reach a maximum curvature, and gradually decreases to coincide with an extended plane of the first rigid board.

According to a fourth feature of the invention, in the board assembly, the flexible board may be preformed by a bending mold having a curvature change approximately equal to a desired curvature change.

According to a fifth feature of the invention, in the board assembly, the first and second rigid boards may be mounted on the objects to provide a predetermined inner angle between extended planes of the first and second rigid boards, the predetermined inner angle being less than a right angle.

According to a sixth feature of the invention, in the board assembly, the flexible board may be attached to a plane of an attaching member, when the flexible board is preformed, the plane of the attaching member having the predetermined inner angle relative to a neighboring plane which faces the second rigid board.

According to a seventh feature of the invention, in the board assembly, the flexible board may be heated to be preformed in a bending mold.

According to an eighth feature of the invention, in the board assembly, a temperature for heating the flexible board may be less than a melting temperature of a solder, which is used for the first and second rigid boards and the flexible board.

According to a ninth feature of the invention, in the board assembly, the flexible board may comprise a signal layer, a ground layer, and insulating layers.

According to a tenth feature of the invention, an optical transceiver, comprises:

a housing for accommodating a board assembly;

an electric circuit; and an optical module;

wherein the board assembly comprises a first rigid board which is connected to the optical module, a second rigid board which is connected to the electric circuit, a flexible board for connecting the first and second rigid boards, the first and second rigid boards are mounted on objects in different positions, the flexible board is preformed to have a curved portion of a predetermined curvature.

According to an eleventh feature of the invention, in the optical transceiver, the first rigid board may be mounted on the optical module in a position perpendicular to an optical axis of the optical module, and the second rigid board is mounted on the electric circuit in a position inclined with the optical axis of the optical module.

According to a twelfth feature of the invention, a method for mounting a board assembly on objects in an electronic/optoelectronic device, comprises steps of:

disposing a bending mold having a curved surface of a curvature change approximately equal to a desired curvature change on an opposite side of the first rigid board in regard to an extended plane of the second rigid board, where the first rigid board is not located;

disposing a plane of an attaching member having a predetermined inner angle relative to a neighboring plane which faces the second rigid board;

placing a flexible board on the curved surface of the bending mold, the flexible board connecting the first and second rigid boards;

attaching the first rigid board to the attaching member;

preforming the flexible board to have a curved portion of the curvature change by heating the flexible board;

carrying the board assembly including the flexible board which was preformed to a mounting position in the electronic/optoelectronic device; and mounting the first and second rigid boards on the each object in the electronic/optoelectronic device.

According to the present invention, it is possible to obtain an effect that a stress occurred in a flexible board can be relaxed.

BRIEF DESCRIPTION OF THE DRAWINGS

The present invention will be explained in more detail in conjunction with appended drawings, wherein:

FIGS. 4A to 4C are diagrams showing an optical transceiver in a second preferred embodiment according to the invention, wherein FIG. 4A shows a cross sectional view of the optical transceiver, FIG. 4B shows a decomposed perspective view of the optical transceiver, and FIG. 4C shows a side view of the optical transceiver;

PREFERRED EMBODIMENTS OF THE INVENTION

Preferred embodiments of the present invention will be explained in detail hereinafter with referring to the appended drawings.

Figure 1:
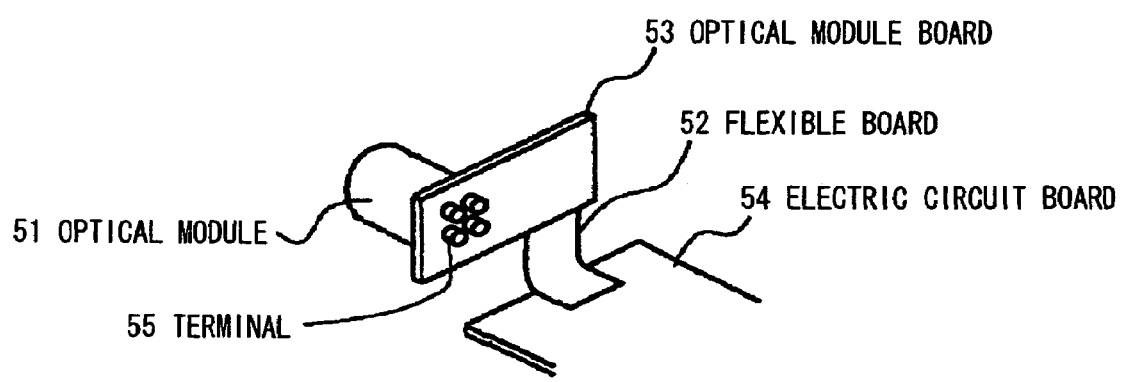
FIG. 1 is a diagram showing a partial perspective view of a conventional optical transceiver.
Figure 2:
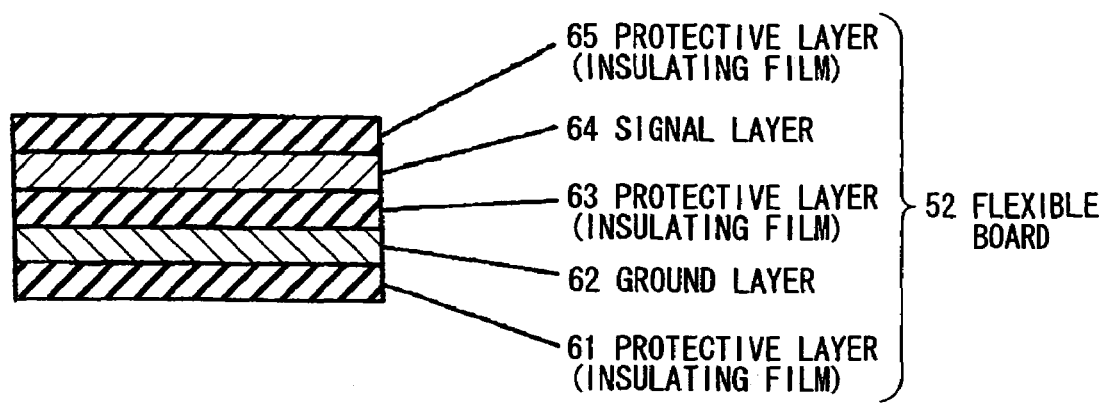
FIG. 2 is a diagram showing a cross sectional view of a flexible board.
Figure 3:
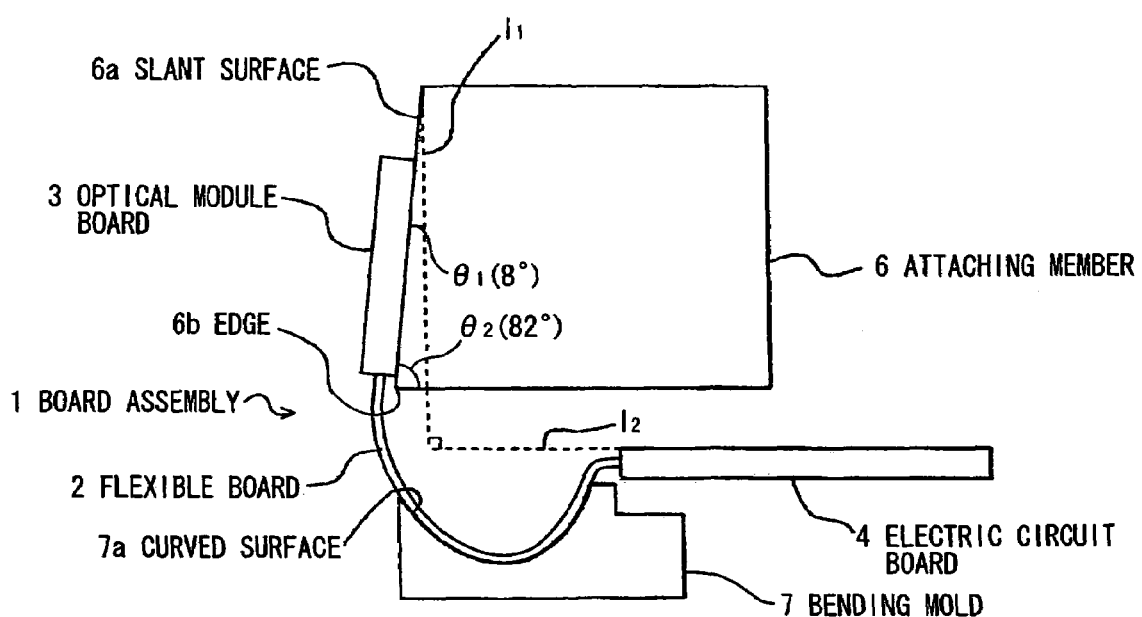
FIG. 3 is a diagram showing a side view of a board assembly during a preforming step in a first preferred embodiment according to the invention.

FIG. 3 is a side view showing a board assembly in the first preferred embodiment according to the invention.

As shown in FIG. 3, a board assembly 1 in the first preferred embodiment according to the invention comprises a flexible board 2, a first rigid board 3, and a second rigid board 4. The first rigid board 3 and the second rigid board 4 connected with each other by the flexible board 2 are mounted on each object (not shown) in different positions. The flexible board 2 is preformed to have a configuration shown in FIG. 3. The flexible board 2 comprises a signal layer, a ground layer and insulating layers. Further, so as to distinguish the first rigid board 3 and second rigid board 4, the first rigid board 3 and the second rigid board 4 are hereinafter referred as "optical module board 3" and "electric circuit board 4", respectively, based on an application for an optical transceiver.

In more detail, FIG. 3 shows the state of conducting a preforming step. The preforming step is a forming step previously conducted for the flexible board 2, when the board assembly 1 comprising the optical module board 3 and the electric circuit board 4 connected with each other by the flexible board 2 is mounted, such that the optical module board 3 and the electric circuit board 4 are mounted on each object (not shown) in different positions.

The preforming step is prepared as follows. A bending mold 7 is firstly provided, on which a curved surface 7a of a curvature change approximately equal to a desired curvature change is formed. The bending mold 7 is provided on an opposite side of the optical module board 3 in regard to an extended plane $l_2$ of the electric circuit board 4, where the optical module board 3 is not located. When viewed from the side section of the board assembly 1, the bending mold 7 is positioned at a space lower than an extended plane $l_2$ of the electric circuit board 4. Simultaneously, an attaching member (fastener) 6 is provided, on which an edge 6b with an angle $\theta_2$ approximately equal to a predetermined inner angle between extended planes of the optical module board 3 and the electric circuit board 4 (the first and second rigid boards 3, 4) when mounted on each object is formed. The attaching member 6 is provided on a side of the optical module board 3 in regard to an extended plane $l_2$ of the electric circuit board 4, where the optical module board 3 is located. When viewed from the side section of the board assembly 1, the attaching member 6 is positioned at a space upper than the extended plane $l_2$ of the electric circuit board 4.

Figure 5:
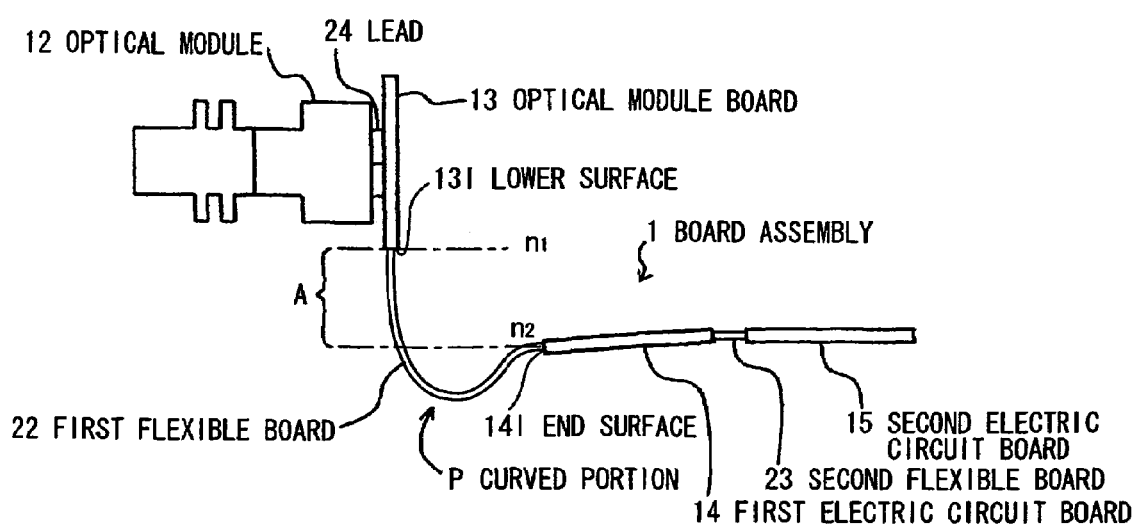
FIG. 5 is a diagram showing a side view of an essential part of the optical transceiver shown in FIGS. 4A to 4C for illustrating an assembled state of the board assembly in the optical transceiver.

The bending mold 7 is disposed such that the curved surface 7a is located in a position, which is distant from an edge of the electric circuit board 4 with a predetermined distance. The curved surface 7a has a shape, which is monotonously excurved to a direction distant from the optical module board 3. In the curved surface 7a, a curvature and a center of curvature gradually change. In the embodiment shown in FIG. 3, the curvature gradually increases from a side near the electric circuit board 4 to reach a maximum curvature (an area in vicinity thereof is called as a curved portion P as shown in FIG. 5 later), and the curvature gradually decreases. In the embodiment shown in FIG. 3, there is used the curved surface 7a of the curvature change completely equal to the curvature change which is expected to be given to the flexible board 2. However, since the bending curve tends to be opened to a certain degree by a so-called spring back phenomenon, when the flexible board 2 is taken out from the bending mold 7 after the preforming step, the curvature of the curved surface 7a may be determined to be slightly greater than the desired curvature.

The attaching member 6 shown in FIG. 3 is provided with the edge 6B having the inner angle $\theta_2$ of 82° or an inner angle slightly sharper than 82°, assuming that the optical module board 3 and electric circuit board 4 are finally mounted in positions that an angle between the optical module board 3 and electric circuit board 4 is 82°. In other words, a slant surface 6a, on which the optical module board 3 is mounted, has an inclination angle $\theta_1$ of 8° to a vertical plane $l_1$. The vertical plane $l_1$ is perpendicular to an extended plane $l_2$, which is parallel to the electric circuit board 4. According to this structure, there is formed the edge 6b having the angle $\theta_2$ approximately equal to the inner angle of 82° between the optical module board 3 and electric circuit board 4, when the optical module board 3 and electric circuit board 4 are mounted on the optical transceiver.

After the aforementioned preparation, the flexible board 2 is provided along the curved surface 7a of the bending mold 7, and the optical module board 3 is attached to the attaching member 6. At this time, the optical module board 3 is taken down to be close to an attaching position to the attaching member 6 shown in FIG. 3 from a position upper than the attaching position to the attaching member 6. Then, a force in a direction extended along the optical module board 3 functions on the flexible board 2, however, the flexible board 2 is bent along the curved surface 7a without buckling as against this force. The preforming step is conducted by heating the flexible board 2, in a state where the flexible board 2 is placed on and just fitted into the bending mold 7. At this time, a temperature to heat the flexible board 2 is preferably less than a melting temperature of the solder, namely a temperature of 100 to 150° C. It is because that the heat will not affect on the solder (such as a pre-solder, a solder which already fixed electrical parts) used for the optical module board 3, electric circuit board 4 or flexible board 2.

As described above, the bending mold 7 is provided on an opposite side of the optical module board 3 in regard to the extended plane $l_2$ of the electric circuit board 4, where the optical module board 3 is not located, and the curved surface 7a is located in a position, which is distant from the edge of the electric circuit board 4 with a predetermined distance. Accordingly, a bending shape of the flexible board 2 is spread approximately straight along the extended plane $l_2$ of the electric circuit board 4, and is once bent to the side where the optical module board 3 is not located. Then, the flexible board 2 is put into the bending mold 7, so that a bending direction is turned over due to the entrance of the flexible board 2 into the bending mold 7. The reversed curvature of the bending gradually decreases to form a curved portion P (shown in FIG. 5), and the curvature gradually increases after preforming the curved portion to exit from the bending mold 7. Thereafter, the flexible board 2 is spread approximately straight as it is and coincides with an extended plane of the optical module board 3.

One of features of this bending configuration is that the curved portion P of the flexible board 2 is not provided on a side of the optical module board 3 in regard to the extended plane $l_2$ of the electric circuit board 4.

Referring to FIG. 5, which will be explained later in more detail, assuming that a virtual line $n_1$ is extended from a lower surface 131 of an optical module board 13 and a virtual line $n_2$ is extended from an connecting part of a first flexible board 22 at an end surface 141 of a first electric circuit board 14 both in parallel with an optical axis O of an optical module 12, the curved portion P is not located within an area A sandwiched by the virtual lines $n_1$ and $n_2$. Herein, the optical module board 13 and the first electric circuit board 14 correspond to the optical module board 3 and the electric circuit board 4 in FIG. 3, respectively.

The flexible board 2 is preformed as described above and cooled off. When the board assembly 1, for which the preforming step is accomplished, is taken out after the preforming and cooling steps, the flexible board 2 maintains the bending configuration as it is. This board assembly 1 is carried into a mounting position, and both the first and second rigid board 3, 4 (the optical module board 3 and electric circuit board 4) are mounted on the each object.

Next, an optical transceiver using a board assembly in a second preferred embodiment according to the invention will be explained below.

Figure 4A:
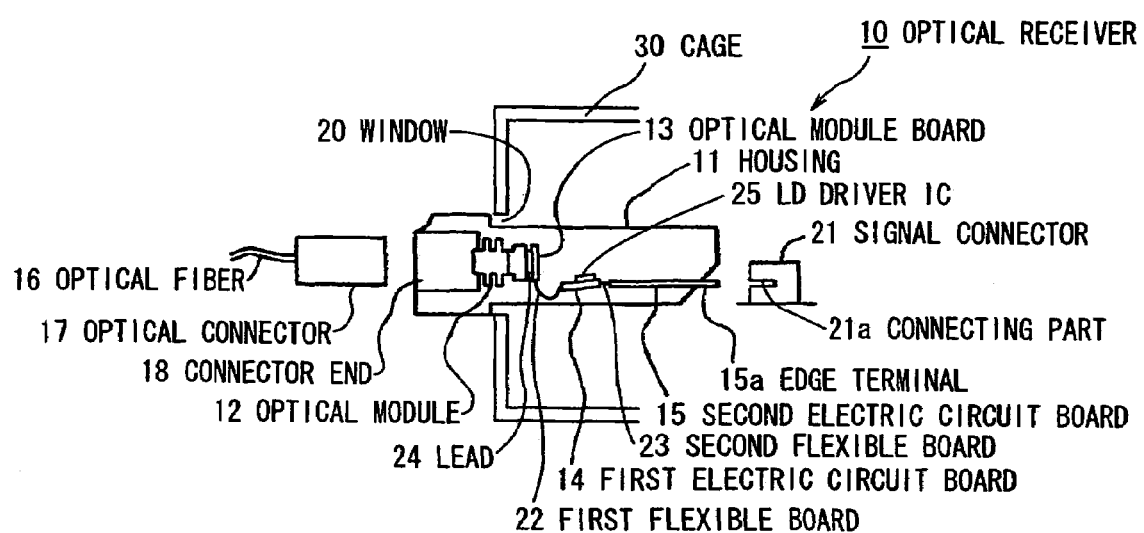
Figure 4B:
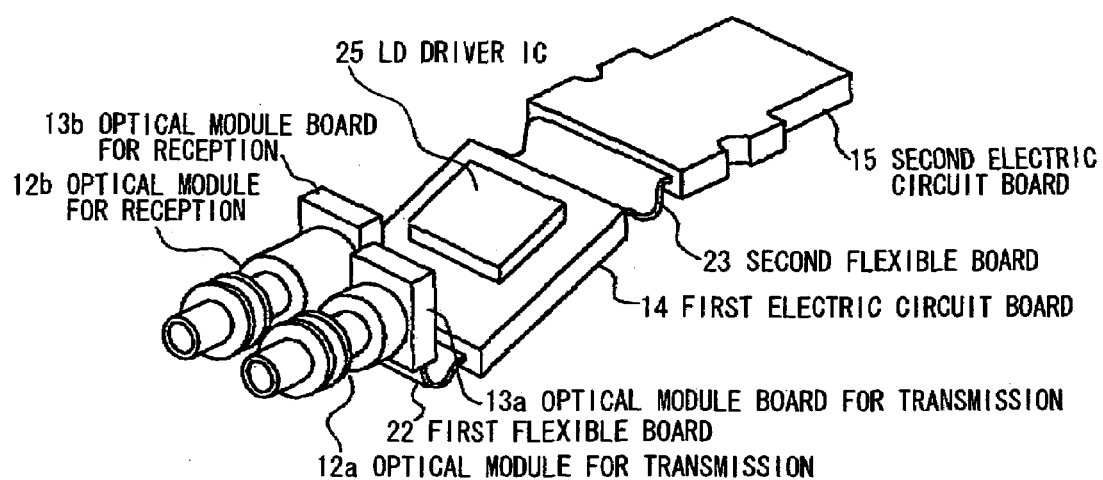
Figure 4C:
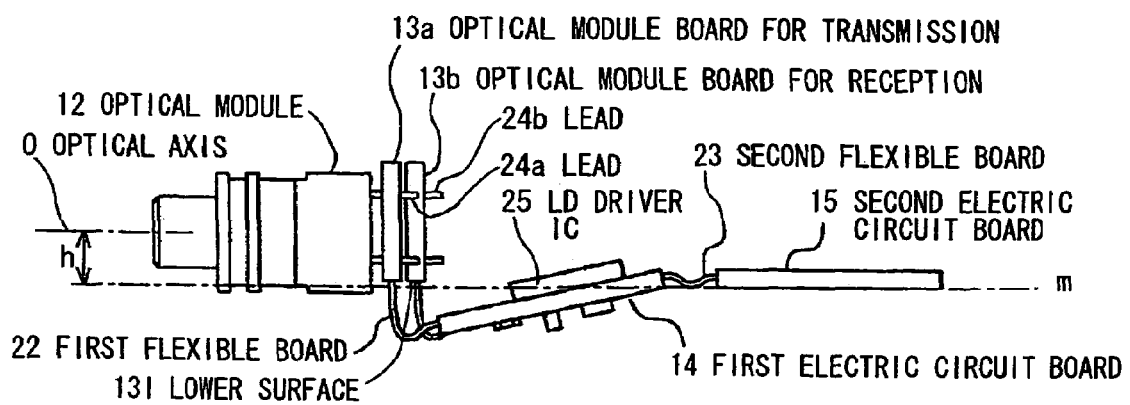

FIGS. 4A to 4C are diagrams showing an optical transceiver using the board assembly in the second preferred embodiment, wherein FIG. 4A shows a decomposed cross sectional view of the optical transceiver, FIG. 4B shows a perspective view of an essential part of the optical transceiver shown in FIG. 4A, and FIG. 4C is a side view of the essential part of the optical transceiver shown in FIG. 4B.

As shown in FIG. 4A, an optical transceiver 10 in the second preferred embodiment of the present invention comprises a housing 11, an optical module 12, an optical module board 13, a first electric circuit board 14 which is mounted on a mounting object (not shown), and further a second electric circuit board 15, which are built in the housing 11. The housing 11 comprises a connector end 18 formed at one end thereof. An optical connector 17 for an optical fiber 16, which is an optical transmission path, is inserted into the connector end 18. A major part of another end of the housing 11 at an opposite side is inserted into a cage 30 in a communication device (not shown). The end of the housing 11 on which the connector end 18 is provided is exposed from a window 20 formed in the communication device. At another end of the housing 11 that is inserted into the cage 30 of the communication device, an edge terminal 15a of the second electric circuit board 15 is exposed from the housing 11 and inserted into a connecting part 21a of a signal connector 21 in the communication device.

The window 20 and the signal connector 21 are members of the communication device, and manufactured separately from the optical transceiver 10. Since there are various kinds of models for the communication device and the optical transceiver 10 produced by plural fabricants, outer dimensions of the housing 11, and positions of the optical module 12 and edge terminal 15a corresponding to those of the window 20 and signal connector 21 are prescribed by a standard, so as to provide a compatibility between various kind of the communication device and optical transceiver 10. For example, a height difference h between an optical axis O and an edge line m extended along a lower surface of the second electric circuit board 15 shown in FIG. 4C should be determined within a range of the standard value.

In more detail, as shown in FIG. 4B, the optical module 12 includes two kinds of optical modules, i.e. an optical module 12a for transmission and an optical module 12b for reception, and the optical modules 12a, 12b are juxtaposed to each other such that optical axes thereof are positioned in parallel. The optical module board 13 is also formed to include an optical module board 13a for transmission and an optical module board 13b for reception, since the two optical modules 12a, 12b are different in their length. These two optical module boards 13a, 13b are connected to the first electric circuit board 14 via a first flexible board 22, respectively. Further, the first electric circuit board 14 is connected to the second electric circuit board 15 via a second flexible board 23.

As shown in FIG. 4C, the optical module board 13 is disposed in a direction vertical to the optical axis O of the optical module 12, which is considered as a reference. Leads 24 are projected from an end surface of the optical module 12 in parallel with the optical axis O. Also the leads 24 include leads 24a for the optical module 12a for transmission and leads 24b for the optical module 12b for reception. The leads 24 are put through through-holes (not shown) of the optical module board 13, and the optical module board 13 is fixed by solder to the optical module 12 such that the optical module board 13 is located correctly opposed to the end surface of the optical module 12.

The second electric circuit board 15 is disposed in parallel with the optical axis O. Further, the second electric circuit board 15 is disposed at a same level as a level of the edge line m. This configuration is determined to comply with the aforementioned standard.

On the first electric circuit board 14, a LD (laser diode) driver IC 25 for driving a LD (not shown) in the optical module 12 is mounted. It is preferable that other circuit components are mounted on a margin of the surface on which the LD driver IC 25 is mounted or on a rear surface as shown in FIG. 4C.

The first electric circuit board 14 is disposed to be inclined with the optical axis O. The reason why the first electric circuit board 14 is inclined is to shorten a transmission distance between the LD and the LD driver IC 25. If the second electric circuit board 15 is merely extended toward the optical module board 13 and the LD driver IC 25 is mounted on the second electric circuit board 15, a flexible board directly connecting the second electric circuit board 15 and optical module board 13 will be excurved in a U-shape, as a result the transmission distance will become longer. Accordingly, the electric circuit board is separated into the first electric circuit board 14 for mounting the LD driver IC 25 and the second electric circuit board 15, and the first electric circuit board 14 is inclined such that the one end of the first electric circuit board 14 is positioned below the lower surface 131 of the optical module board 13.

As shown in FIG. 5, the optical transceiver in the second preferred embodiment according to the present invention employs a board assembly 1 in which the optical module board 13, first electric circuit board 14 and second electric circuit board 15 are integrally connected by means of the first and second flexible boards 22, 23.

The optical module board 13 comprises through-holes (not shown) for inserting the leads 24, which are projected from an end surface of the optical module 12 in a direction parallel to the optical axis O. The optical module board 13 is fixed to oppose the end surface of the optical module 12 by soldering the leads 24 to the through-holes. In other words, the optical module board 13 is mounted on the optical module 12 in a position vertical to the optical axis O of the optical module 12. Since the optical module 12 is accommodated in the housing 11 such that the optical axis O is positioned parallel to a bottom surface of the housing 11, the optical module 12 is positioned in perpendicular to the bottom surface of the housing 11.

The first electric circuit board 13 is accommodated in the housing 11 such that the surfaces of the first electric circuit board 13 is inclined to the bottom surface of the housing 11. Accordingly, the first electric circuit board 14 and optical module board 13 are positioned such that an inner angle between the first electric circuit board 14 and optical module board 13 is narrower than a right angle. The second electric circuit board 15 is accommodated in the housing 11 such that the second electric circuit board 15 is positioned in parallel with the bottom surface of the housing 11 to coincide with the edge line m. Since the first electric circuit board 14 is inclined with the bottom surface of the housing 11 and the second electric circuit board 15 is in parallel with the bottom surface of the housing 11, the first electric circuit board 14 and second electric circuit board 15 are connected with each other by the flexible board 23. In addition, the flexible board 23 has an effect that a force applied to the second electric circuit board 15 does not affect on the first electric circuit board 14.

The board assembly 1 is formed as shown in FIG. 3, during the process of assembling the optical transceiver shown in FIG. 5. As a result, since the first flexible board 22 is formed in a predetermined shape such that the inner angle between the first electric circuit board 14 and optical module board 13 is narrower than a right angle, the first flexible board 22, optical module board 13, and first electric circuit board 14 are located in a predetermined position as they are, when the board assembly 1 is carried into the housing 11.

After the board assembly 1 is carried into the housing 11, the first electric circuit board 14 is fixed to a rib (not shown) of the housing 11 with screw, and the optical module board 13 is mounted by solder to the leads 24 of the optical module 12. At this time, the optical module board 13 is mounted in perpendicular to the optical axis O of the optical module 12, so that the first flexible board 22 is energized slightly. However, the stress is not so great that it may cause a problem. Therefore, the problems of strain of the leads and misalignment of the optical axis can be overcome.

In the preferred embodiments, the board assembly 1 for an optical transceiver comprising the optical module board (3, 13) and first electric circuit board (4, 14) connected by the first flexible board (2, 22) is described. However, the invention is not limited to the aforementioned preferred embodiments, and the present invention can be used for a board assembly of various kinds of application. In FIG. 3, the first rigid board 3 and second rigid board 4 connected by the flexible board 2 are positioned to make an inner angle of 82°, but it is not limited thereto. A desired effect can be obtained by preforming the board assembly according to the position of the first and second rigid boards 3, 4 of various angles.

Figure 6:
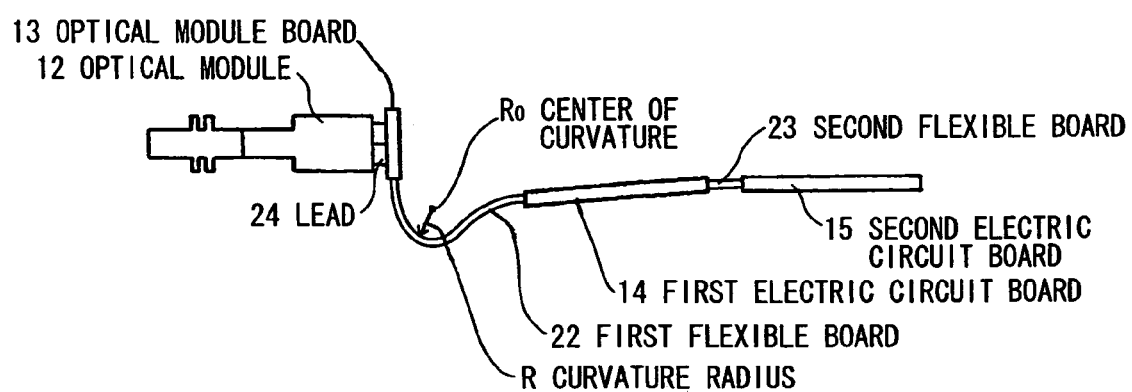
FIG. 6 is a diagram showing a side view of the board assembly in the optical transceiver shown in FIGS. 4A to 4C.

FIG. 6 is a diagram showing an operative example of the board assembly 1. In this board assembly 1, a length of a first flexible board 22 from an optical module board (first rigid board) 13 is 2.5 mm, a curvature radius R in the curved portion P is 0.38 mm.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A board assembly, comprising:
 a first rigid board including an optical module;
 a second rigid board; and
 a first flexible board for connecting the first rigid board and the second rigid board,
 wherein the first and second rigid boards are mounted on objects in different positions, and the flexible board is preformed to have a curved portion of a predetermined curvature, and
 wherein the second rigid board comprises first and second rigid portions connected by a second flexible board, the first rigid portion including a driver circuit for the optical module and being connected to the first rigid board by the first flexible board, and the second rigid portion being formed at a same level as an edge of the first rigid board.

2. The board assembly, according to claim 1, wherein:
 the curved portion of the first flexible board is provided on an opposite side of the first rigid board in regard to an extended plane of the first rigid portion of the second rigid board, where the first rigid board is not located.

3. The board assembly, according to claim 1, wherein:
 the first flexible board is bent once at a space lower than an extended plane of the first rigid portion of the second rigid board where the first rigid board is not located, a curve direction is then inverted, a curvature gradually increases to reach a maximum curvature, and gradually decreases to coincide with an extended plane of the first rigid board.

4. The board assembly, according to claim 1, wherein:
 the first rigid board and the first rigid portion of the second rigid board are mounted on the objects to provide a predetermined inner angle between extended planes of the first rigid board and the first rigid portion of the second rigid board, the predetermined inner angle being less than a right angle.

5. The board assembly, according to claim 1, wherein:
 the first and second flexible boards comprises a signal layer, a ground layer, and insulating layers.

6. The board assembly according to claim 1, wherein:
 the first rigid portion is inclined in a direction from the first rigid board toward the second rigid portion.

7. The board assembly according to claim 1, wherein:
 the first rigid board is disposed in a direction perpendicular to an optical axis of the optical module, the first rigid portion is disposed to be inclined with respect to the optical axis, and the second rigid portion is disposed in parallel with the optical axis and to coincide with an edge line of the first rigid board.

8. The board assembly according to claim 1, further comprising:
 an optical assembly comprising the first rigid board including the optical module.

9. The board assembly according to claim 8, wherein:
 the optical assembly comprises plural optical assemblies.

10. An optical transceiver, comprising:
 a housing for accommodating a board assembly;
 an electric circuit; and
 an optical module;
 wherein the board assembly comprises a first rigid board which is connected to the optical module, a second rigid board which is connected to the electric circuit, and a first flexible board for connecting the first and second rigid boards, and the first and second rigid boards are mounted on objects in different positions, the first flexible board is preformed to have a curved portion of a predetermined curvature, and
 wherein the second rigid board comprises first and second rigid portions connected by a second flexible board, the first rigid portion including a driver circuit for the optical module and being connected to the first rigid board by the first flexible board, and the second rigid portion being formed at a same level as an edge of the first rigid board.

11. The optical transceiver, according to claim 10, wherein:
 the first rigid board is mounted on the optical module in a position perpendicular to an optical axis of the optical module, and the first rigid portion of the second rigid board is mounted on the electric circuit in a position inclined with the optical axis of the optical module.

12. The optical transceiver according to claim 10, wherein:
 the first rigid portion is inclined in a direction from the first rigid board toward the second rigid portion.

13. The optical transceiver according to claim 10, wherein:
 the first rigid board is disposed in a direction perpendicular to an optical axis of the optical module, the first rigid portion is disposed to be inclined with respect to an optical axis, and the second rigid portion is disposed in parallel with the optical axis and to coincide with an edge line of the first rigid board.

14. A method for mounting a board assembly on objects in an electronic/optoelectronic device, comprising:
disposing a bending mold having a curved surface of a curvature change approximately equal to a desired curvature change on an opposite side of the first rigid board in regard to an extended plane of the second rigid board, where the first rigid board is not located;
disposing a plane of an attaching member having a predetermined inner angle relative to a neighboring plane which faces the second rigid board;
placing a flexible board on the curved surface of the bending mold, the flexible board connecting the first and second rigid boards;
attaching the first rigid board to the attaching member;
preforming the flexible board to have a curved portion of the curvature change by heating the flexible board;
carrying the board assembly including the flexible board which was preformed to a mounting position in the electronic/optoelectronic device; and
mounting the first and second rigid boards on the each object in the electronic/optoelectronic device.

* * * * *